United States Patent
Aziz et al.

(10) Patent No.: US 7,449,831 B2
(45) Date of Patent: *Nov. 11, 2008

(54) OLEDS HAVING INORGANIC MATERIAL CONTAINING ANODE CAPPING LAYER

(75) Inventors: Hany Aziz, Oakville (CA); Zoran D. Popovic, Mississauga (CA); Jennifer A. Coggan, Cambridge (CA)

(73) Assignee: LG Display Co., Ltd., Seoul (KR)

( * ) Notice: Subject to any disclaimer, the term of this patent is extended or adjusted under 35 U.S.C. 154(b) by 284 days.

This patent is subject to a terminal disclaimer.

(21) Appl. No.: 10/909,691

(22) Filed: Aug. 2, 2004

(65) Prior Publication Data

US 2006/0022590 A1    Feb. 2, 2006

(51) Int. Cl.
*H05B 33/14* (2006.01)
*H01L 51/50* (2006.01)

(52) U.S. Cl. .............. 313/504; 313/506; 428/690; 428/917

(58) Field of Classification Search ............... None
See application file for complete search history.

(56) References Cited

U.S. PATENT DOCUMENTS

| | | |
|---|---|---|
| 2,823,905 A | 2/1958 | Clay |
| 3,172,862 A | 3/1965 | Gurnee et al. |
| 3,598,644 A | 8/1971 | Goffe et al. |
| 4,084,966 A | 4/1978 | Haas et al. |
| 4,287,449 A | 9/1981 | Takeda et al. |
| 4,356,429 A | 10/1982 | Tang |
| 4,539,507 A | 9/1985 | VanSlyke et al. |
| 4,652,794 A | 3/1987 | Waite et al. |
| 4,665,115 A | 5/1987 | Lundberg et al. |
| 4,720,432 A | 1/1988 | VanSlyke et al. |
| 4,769,292 A | 9/1988 | Tang et al. |
| 4,885,211 A | 12/1989 | Tang et al. |
| 5,049,780 A | 9/1991 | Dobrowolski et al. |
| 5,059,861 A | 10/1991 | Littman et al. |
| 5,141,671 A | 8/1992 | Bryan et al. |
| 5,150,006 A | 9/1992 | Van Slyke et al. |
| 5,151,629 A | 9/1992 | VanSlyke et al. |
| 5,227,252 A | 7/1993 | Murayama et al. |

(Continued)

FOREIGN PATENT DOCUMENTS

EP    09 77 287 A2    2/2000

(Continued)

OTHER PUBLICATIONS

'Very-low-operating -voltage organic light emitting diodes using p-doped amorphous hole-injection layer' by Zhou et al. Appl. Phys. Letters, Jan. 2001, pp. 410-412.*

(Continued)

*Primary Examiner*—Sikha Roy
(74) *Attorney, Agent, or Firm*—McKenna Long & Aldridge LLP

(57) ABSTRACT

An organic light emitting device composed of: a cathode; a layer including an organic electroluminescent material; a layer including an electron accepting material; an anode capping layer comprising an inorganic material; an anode; and a substrate in the sequence before the cathode or after the anode, wherein the anode capping layer is selected to provide the device with a luminance stability ratio that is greater than 1.

32 Claims, 1 Drawing Sheet

U.S. PATENT DOCUMENTS

| | | | |
|---|---|---|---|
| 5,247,190 A | 9/1993 | Friend et al. | |
| 5,276,381 A | 1/1994 | Wakimoto et al. | |
| 5,429,884 A | 7/1995 | Namiki et al. | |
| 5,457,565 A | 10/1995 | Namiki et al. | |
| 5,516,577 A | 5/1996 | Matsuura et al. | |
| 5,593,788 A | 1/1997 | Shi et al. | |
| 5,601,903 A | 2/1997 | Fijii et al. | |
| 5,608,287 A | 3/1997 | Hung et al. | |
| 5,703,436 A | 12/1997 | Forrest et al. | |
| 5,707,745 A | 1/1998 | Forrest et al. | |
| 5,719,467 A | 2/1998 | Antoniadis et al. | |
| 5,728,801 A | 3/1998 | Wu et al. | |
| 5,739,635 A | 4/1998 | Wakimoto | |
| 5,776,622 A | 7/1998 | Hung et al. | |
| 5,837,391 A | 11/1998 | Utsugi | |
| 5,846,666 A | 12/1998 | Hu et al. | |
| 5,853,905 A | 12/1998 | So et al. | |
| 5,925,472 A | 7/1999 | Hu et al. | |
| 5,925,980 A | 7/1999 | So et al. | |
| 5,935,720 A | 8/1999 | Chen et al. | |
| 5,935,721 A | 8/1999 | Shi et al. | |
| 5,942,340 A | 8/1999 | Hu et al. | |
| 5,952,115 A | 9/1999 | Hu et al. | |
| 5,972,247 A | 10/1999 | Shi et al. | |
| 6,023,073 A | 2/2000 | Strite | |
| 6,028,327 A | 2/2000 | Mizoguchi et al. | |
| 6,057,048 A | 5/2000 | Hu et al. | |
| 6,105,202 A | 8/2000 | Grasso et al. | |
| 6,130,001 A | 10/2000 | Shi et al. | |
| 6,225,467 B1 | 5/2001 | Esteghamatian et al. | |
| 6,229,012 B1 | 5/2001 | Hu et al. | |
| 6,303,250 B1 | 10/2001 | Watanabe et al. | |
| 6,392,250 B1 | 5/2002 | Aziz et al. | 257/40 |
| 6,392,339 B1 | 5/2002 | Aziz et al. | 313/504 |
| 6,423,429 B2 | 7/2002 | Kido et al. | |
| 6,437,123 B1 | 8/2002 | Bock et al. | |
| 6,465,115 B2 | 10/2002 | Shi et al. | |
| 6,479,172 B2 | 11/2002 | Hu et al. | |
| 6,562,485 B2 | 5/2003 | Hu et al. | |
| 6,565,996 B2 | 5/2003 | Hatwar et al. | |
| 6,566,807 B1 * | 5/2003 | Fujita et al. | 313/506 |
| 6,614,175 B2 | 9/2003 | Aziz et al. | 313/504 |
| 6,660,411 B2 * | 12/2003 | Sato et al. | 428/690 |
| 6,734,625 B2 | 5/2004 | Vong et al. | 313/509 |
| 6,737,177 B2 | 5/2004 | Aziz et al. | |
| 6,740,429 B2 | 5/2004 | Aziz et al. | |
| 6,750,609 B2 | 6/2004 | Aziz et al. | |
| 6,753,098 B2 | 6/2004 | Aziz et al. | |
| 6,759,146 B2 | 7/2004 | Aziz et al. | |
| 6,773,830 B2 | 8/2004 | Aziz et al. | |
| 6,818,329 B1 * | 11/2004 | Liao et al. | 428/690 |
| 6,821,643 B1 | 11/2004 | Hu et al. | |
| 7,211,948 B2 | 5/2007 | Liao et al. | |
| 7,288,887 B2 | 10/2007 | Aziz et al. | |
| 7,291,404 B2 | 11/2007 | Aziz et al. | |
| 2002/0037398 A1 | 3/2002 | Tofuku et al. | |
| 2002/0121860 A1 | 9/2002 | Seo et al. | |
| 2002/0180349 A1 * | 12/2002 | Aziz et al. | 313/506 |
| 2003/0116772 A1 | 6/2003 | Yamazaki et al. | |
| 2003/0230974 A1 | 12/2003 | Chang et al. | |
| 2003/0234609 A1 | 12/2003 | Aziz et al. | |
| 2004/0004433 A1 | 1/2004 | Lamansky et al. | |
| 2004/0009418 A1 | 1/2004 | Main et al. | |
| 2005/0175857 A1 | 8/2005 | Coggan et al. | |
| 2006/0022585 A1 | 2/2006 | Aziz et al. | |
| 2006/0022590 A1 | 2/2006 | Aziz et al. | |
| 2006/0105202 A1 | 5/2006 | Kitamura | |
| 2006/0139516 A1 | 6/2006 | Park | |
| 2006/0251920 A1 | 11/2006 | Aziz et al. | |
| 2006/0261727 A1 | 11/2006 | Aziz et al. | |
| 2006/0261731 A1 | 11/2006 | Aziz et al. | |
| 2006/0263593 A1 | 11/2006 | Aziz et al. | |
| 2006/0263628 A1 | 11/2006 | Aziz et al. | |
| 2006/0263629 A1 | 11/2006 | Aziz et al. | |

FOREIGN PATENT DOCUMENTS

| | | |
|---|---|---|
| EP | 09 772 88 A2 | 2/2000 |
| EP | 1 009 044 A2 | 6/2000 |
| EP | 1017118 | 7/2000 |
| EP | 1 029 832 A1 | 8/2000 |
| EP | 1 160 890 A2 | 12/2001 |
| EP | 1167488 | 1/2002 |
| EP | 1 311 139 A1 | 5/2003 |
| EP | 1 339 112 A2 | 8/2003 |
| EP | 1 624 503 A2 | 2/2006 |
| EP | 1 624 504 A2 | 2/2006 |
| EP | 1 010 359 B1 | 4/2006 |
| JP | 8-222374 A | 8/1996 |
| JP | 2002-055203 A | 2/2002 |
| JP | 2004-139981 | 5/2004 |
| WO | WO 97/33296 A1 | 9/1997 |
| WO | WO 98/41065 A1 | 9/1998 |
| WO | WO 01/06816 A1 | 1/2001 |
| WO | WO 01/08240 A1 | 2/2001 |
| WO | WO 03055275 | 7/2003 |
| WO | WO 03088718 | 10/2003 |
| WO | WO 2006/033472 A1 | 3/2006 |
| WO | WO 2006/038573 A1 | 4/2006 |
| WO | WO 2006/076092 A1 | 7/2006 |

OTHER PUBLICATIONS

Copy of European Search Report dated Apr 5, 2006.

Chengfeng Qiu et al., "Praseodymium Oxide Coated Anode for Organic Light-Emitting Diode," *Applied Physics Letters*, vol. 80, No. 19, pp. 3485-3487 (May 13, 2002).

S. A. Van Slyke et al., "Organic Electroluminescent Devices With Improved Stability," *Applied Physics Letters*, vol. 69, No. 15, pp. 2160-2162 (Oct. 7, 1996).

L. S. Hung et al., "Anode Modification in Organic Light-Emitting Diodes by Low-Frequency Plasma Polymerization of $CHF_3$," *Applied Physics Letters*, vol. 78, No. 5, pp. 673-675 (Jan. 29, 2001).

Soo-Jin Chua et al., "Stabilization of Electrode Migration in Polymer Electroluminescent Devices," *Applied Physics Letters*, vol. 81, No. 6, pp. 1119-1121 (Aug. 5, 2002).

S. Karg et al., "Increased Brightness and Lifetime of Polymer Light-Emitting Diodes With Polyaniline Anodes," *Synthetic Metals*, vol. 80, pp. 111-117 (1996).

Z. B. Deng et al., "Enhanced Brightness and Efficiency in Organic Electroluminscent Devices Using $SiO_2$ Buffer Layers," *Applied Physics Letters*, vol. 74, No. 15, pp. 2227-2229 (Apr. 12, 1999).

Hongjin Jiang et al., "Improvement of Organic Light-Emitting Diodes Performance by the Insertion of a $Si_3N_4$ Layer," *Thin Solid Films*, vol. 363, pp. 25-28 (2000).

A. Gyoutoku et al., "An Organic Electroluminescent Dot-Matrix Display Using Carbon Underlayer," *Synthetic Metals*, vol. 91, pp. 73-75 (1997).

S. A. Van Slyke et al., "Organic Electroluminescent Devices with Improved Stability", Appl. Phys. Lett. 69, (15) pp. 2160-2162 (1996).

Bernius et al., "Developmental Progress of Electroluminescent Polymeric Materials and Devices" Proceedings of SPIE Conference on Organic Light Emitting Materials and Devices III, Denver, Colo., vol. 3797, p. 129-137 (Jul. 1999).

Kido et al., "White light emitting organic electroluminescent device using lanthanide complexes," Jpn. J. Appl. Phys., vol. 35, pp. L394-L396 (1996).

Baldo et al., "Highly efficient organic phosphorescent emission from organic electroluminescent devices," Letters to Nature, vol. 395, pp. 151-154 (1998).

Chen et al. Appl. Phys. Lett. 83, 5127 (2003).

Kim et al., "*Anode material based on Zr-doped ZnO thin films for organic light-emitting diodes*", Appl. Phys. Lett., vol. 83, No. 18, pp. 3809-3811 (Nov. 3, 2003).

Carter et al., "*Polymeric anodes for improved polymer light-emitting diode performance*", Appl. Phys. Lett. 70 (16), pp. 2067-2069 (Apr. 21, 1997).

Kim et al., "*Molecular organ light-emitting diodes using highly conducting polymers as anodes*", Appl. Phys. Lett., vol. 80, No. 20, pp. 3844-3846 (May 20, 2002).

Zugang et al., "*Organic thin film electroluminescent devices with ZnO:Al as the anode*," J. Phys.: Condens. Matter 8, pp. 3221-3228 (1996).

Endo et al., "*Organic Electroluminescent Devices with a Vacuum-Deposited Lewis-Acid-Doped Hole-Injecting Layer*", Jpn. J. Appl. Phys., vol. 41 Pt. 2 No. 3B, L358-360 (Mar. 15, 2002).

Aziz et al., "Reduced reflectance cathode for organic light-emitting devices using metal organic mixtures", Applied Physics Letters, vol. 83, No. 1, pp. 186-188 (2003).

Day et al., "The use of charge transfer interlayers to control hole injection in molecular organic light emitting diodes", Thin Solid Films, vol. 410, pp. 159-166 (Mar. 2002).

Gardin et al., "Light-Absorption Phenomena in Novel Low-Reflectance Cathodes for Organic Light-Emitting Devices Utilizing Metal-Organic Mixtures", Advanced Materials, vol. 15, No. 23, pp. 2021-2024 (Dec. 2003).

Hyun-Ouk Ha et al., "Improving the efficiency of organic electroluminescent devices by introducing an electron-accepting and thermally stable polymer", Optical Materials, vol. 21 pp. 165-168 (2002).

Liu et al., "Development of highly stable organic electroluminescent devices with a doped co-host emitter system", Current Applied Physics 5, pp. 218-221 (2005).

Hany Aziz et al., U.S. Appl. No. unavailable, filed on the same day as the present application, titled "OLEDS Having Improved Luminance Stability.", Aug. 2, 2004.

Chengfeng Qui et al., "Comparative Study of Metal or Oxide Capped Indium-Tin Oxide Anodes for Organic Light-Emitting Diodes," *Journal of Applied Physics*, vol. 93, No. 6, pp. 3253-3257 (Mar. 15, 2003).

Yulong Shen et al., "Modification of Indium Tin Oxide for Improved Hole Injection in Organic Light Emitting Diodes," *Advanced Materials*, vol. 13, No. 16, pp. 1234-1238 (Aug. 16, 2001).

I-Min Chan et al., "Enhanced Hole Injections in Organic Light-Emitting Devices by Depositing Nickel Oxide on Indium Tin Oxide Anode," *Applied Physics Letters*, vol. 81, No. 10, pp. 1899-1901 (Sep. 2, 2002).

Chieh-Wei Chen et al., "Top-Emitting Organic Light-Emitting Devices Using Surface-Modified Ag Anode," *Applied Physics Letters*, vol. 83, No. 25, pp. 5127-5129 (Dec. 22, 2003).

Wenping Hu et al., "Lowering of Operational Voltage of Organic Electroluminescent Devices by Coating Indium-Tin-Oxide Electrodes with a Thin $CuO_x$ Layer," *Applied Physics Letters*, vol. 80, No. 15, pp. 2640-2641 (Apr. 15, 2002).

\* cited by examiner

OLEDS HAVING INORGANIC MATERIAL CONTAINING ANODE CAPPING LAYER

CROSS-REFERENCE TO RELATED APPLICATIONS

Hany Aziz et al., U.S. application Ser. No. 10/909,689, filed on the same day as the present application, titled "OLEDS HAVING IMPROVED LUMINANCE STABILITY."

BACKGROUND OF THE INVENTION

Organic Light Emitting Devices (referred herein as "OLED" or "OLEDs") represent a promising technology for display applications. For full color display applications, red-emitting, green-emitting and blue-emitting OLEDs with satisfactory performance are desired. Although in terms of efficiency and brightness, OLEDs can be utilized in the majority of display applications, their luminance stability continues to be a limiting factor, especially for blue-emitting OLEDs. Although recent advances have led to the realization of red-emitting and green-emitting OLEDs with a half-life exceeding 10,000 hours, thus making them suitable for a number of commercial applications (e.g., avionic and automotive displays, and personal and hand held electronics), luminance stability of blue-emitting OLEDs is still limited in many instances to about 1,000 hours, rendering them unsuitable for many of these applications. Therefore, there is still a need, addressed by embodiments of the present invention, to increase the luminance stability of OLEDs emitting in various colors in general, and in blue in particular, to make them suitable for utilization in a wide variety of commercial applications.

The following documents provide background information:

Vong et al., U.S. Pat. No. 6,734,625 B2.

Aziz et al., U.S. Patent Application Publication 2002/0180349 A1.

Lamansky et al., U.S. Patent Application Publication 2004/0004433 A1.

Chengfeng Qiu et al., "Comparative Study of Metal or Oxide Capped Indium-Tin Oxide Anodes for Organic Light-Emitting Diodes," *Journal of Applied Physics*, Vol. 93, No. 6, pp. 3253-3257 (Mar. 15, 2003).

Yulong Shen et al., "Modification of Indium Tin Oxide for Improved Hole Injection in Organic Light Emitting Diodes," *Advanced Materials*, Vol. 13, No. 16, pp. 1234-1238 (Aug. 16, 2001).

I-Min Chan et al., "Enhanced Hole Injections in Organic Light-Emitting Devices by Depositing Nickel Oxide on Indium Tin Oxide Anode," *Applied Physics Letters*, Vol. 81, No. 10, pp. 1899-1901 (Sep. 2, 2002).

Chieh-Wei Chen et al., "Top-Emitting Organic Light-Emitting Devices Using Surface-Modified Ag Anode," *Applied Physics Letters*, Vol. 83, No. 25, pp. 5127-5129 (Dec. 22, 2003).

Wenping Hu et al., "Lowering of Operational Voltage of Organic Electroluminescent Devices by Coating Indium-Tin-Oxide Electrodes with a Thin $CuO_x$ Layer," *Applied Physics Letters*, Vol. 80, No. 15, pp. 2640-2641 (Apr. 15, 2002).

Chengfeng Qiu et al., "Praseodymium Oxide Coated Anode for Organic Light-Emitting Diode," *Applied Physics Letters*, Vol. 80, No. 19, pp. 3485-3487 (May 13, 2002).

S. A. Van Slyke et al., "Organic Electroluminescent Devices With Improved Stability," *Applied Physics Letters*, Vol. 69, No. 15, pp. 2160-2162 (Oct. 7, 1996).

L. S. Hung et al., "Anode Modification in Organic Light-Emitting Diodes by Low-Frequency Plasma Polymerizaiton of $CHF_3$," *Applied Physics Letters*, Vol. 78, No. 5, pp. 673-675 (Jan. 29, 2001).

Soo-Jin Chua et al., "Stabilization of Electrode Migration in Polymer Electroluminescent Devices," *Applied Physics Letters*, Vol. 81, No. 6, pp. 1119-1121 (Aug. 5, 2002).

S. Karg et al., "Increased Brightness and Lifetime of Polymer Light-Emitting Diodes With Polyaniline Anodes," *Synthetic Metals*, Vol. 80, pp. 111-117 (1996).

Z. B. Deng et al., "Enhanced Brightness and Efficiency in Organic Electroluminscent Devices Using $SiO_2$ Buffer Layers," *Applied Physics Letters*, Vol. 74, No. 15, pp. 2227-2229 (Apr. 12, 1999).

Hongjin Jiang et al., "Improvement of Organic Light-Emitting Diodes Performance by the Insertion of a $Si_3N_4$ Layer," *Thin Solid Films*, Vol. 363, pp. 25-28 (2000).

A. Gyoutoku et al., "An Organic Electroluminescent Dot-Matix Display Using Carbon Underlayer," *Synthetic Metals*, Vol. 91, pp. 73-75 (1997).

SUMMARY OF THE DISCLOSURE

In embodiments of the present invention, there is provided an organic light emitting device comprising:
- a cathode;
- a layer including an organic electroluminescent material and a charge transport material;
- a layer including an electron accepting material;
- an anode capping layer;
- an anode; and
- a substrate in the sequence before the cathode or after the anode.

In further embodiments, there is provided an organic light emitting device comprising:
- a cathode;
- a layer including a blue organic electroluminescent material and a charge transport material;
- a layer including an electron accepting material;
- an anode capping layer comprising an elemental metal, or a metal alloy, or a mixture of the elemental metal and the metal alloy;
- an anode; and
- a substrate in the sequence before the cathode or after the anode.

Additional embodiments include an organic light emitting device comprising:
- a cathode;
- a layer including an organic electroluminescent material;
- a layer including an electron accepting material;
- an anode capping layer comprising an inorganic material;
- an anode; and
- a substrate in the sequence before the cathode or after the anode,
- wherein the anode capping layer is selected to provide the device with a luminance stability ratio that is greater than 1.

In other embodiments, there is provided an organic light emitting device comprising:
- a cathode;
- a layer including an organic electroluminescent material;
- a layer including an electron accepting material;
- an anode capping layer including an elemental metal, or a metal alloy, or a mixture of the elemental metal and the metal alloy;
- an anode; and a substrate in the sequence before the cathode or after the anode, wherein the anode capping layer is selected to provide the device with a luminance stability ratio that is greater than 1.

DESCRIPTION OF THE DRAWINGS

The accompanying drawings, which are included to provide a further understanding of the invention and are incorporated in and constitute a part of this specification, illustrate an exemplary embodiment of the invention and together with the description serve to explain the principles of the invention.

In the drawings.

DETAILED DESCRIPTION

Figure 1:
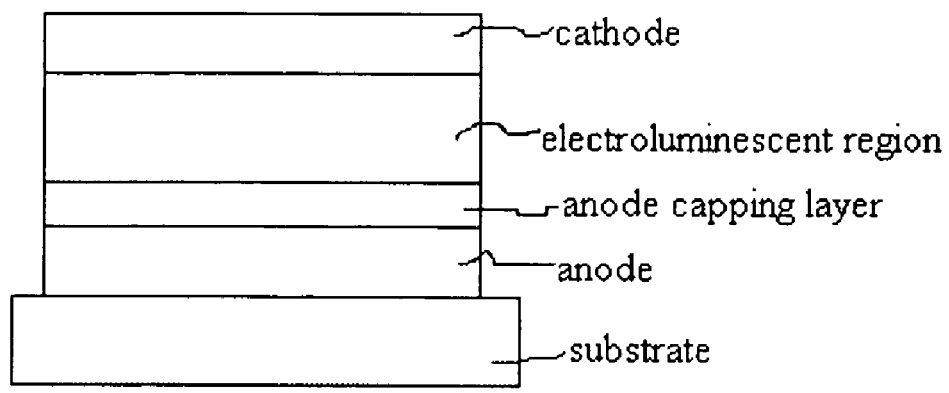
FIG. 1 is an exemplary embodiment of the present invention.

As used herein, "luminance stability" or "stability" refers to the length of time that an OLED emits light; unless otherwise noted, any recited value for the "luminance stability" is the half-life in hours of the OLED where half-life is the length of time that the emitted light drops in intensity by 50% after the initial burn-in period.

The term "layer" indicates a single coating generally having a composition that differs from the composition of an adjacent layer.

One, two, three or more adjacent layers may be collectively referred to as a "region."

The term "zone" refers to a functional area in a layer where there may be one, two, three or more "zones" (i.e., functional areas) in a layer.

For convenience, the layer including an organic electroluminescent material is referred herein as "electroluminescent layer."

For convenience, the layer including an electron accepting material is referred herein as "electron accepting layer."

For certain layers, there may not be a universally accepted classification system for designating those layers as belonging to a particular region of the OLED (such as "Cathode," Light Emitting Region," "Anode Capping Region," "Anode," and "Substrate"). For example, the anode capping layer is described in the section pertaining to the "Anode Capping Region" but the anode capping layer (and the "Anode Capping Region") could alternatively have been designated as part of the "Anode." In addition, in certain embodiments, the electron accepting layer may be described as part of the "Light Emitting Region," whereas in other embodiments the electron accepting layer may be described as part of the "Anode Capping Region." While the OLED region names is a useful classification system, it is recognized that the present invention is not limited by any arbitrary designation of certain layers as being part of one region or as part of another adjacent region.

Embodiments of the present invention encompass one or more additional layers in the OLED configurations inserted in the sequence before or after each of the electroluminescent layer, the electron accepting layer and the anode capping layer while maintaining the general sequence (referred herein as "General Sequence") of the cathode, the electroluminescent layer, the electron accepting layer, the anode capping layer, and the anode, wherein the substrate can be before the cathode or after the anode. For example, in embodiments where there are two anode capping layers, the electron accepting layer may be sandwiched between the two anode capping layers; in such embodiments, the presence of the additional anode capping layer before the electron accepting layer does not break the General Sequence since the electron accepting layer is still after the electroluminescent layer and there is an anode capping layer after the electron accepting layer.

The layers of the present OLEDs may be transparent (light transmissive) or opaque (non-light transmissive) depending on the side of the OLED that is facing the viewer. In embodiments, either the anode side, the cathode side, or both the anode side and the cathode side may be light transmissive. In embodiments, light transmissive layers of the present OLEDs have a degree of light transmission of visible light of for example at least about 70%, or at least about 90%. Illustrative materials will now be discussed in constructing embodiments of the present OLED.

Cathode

A cathode is composed of one, two, or more layers. The thickness of the cathode can range from, for example, about 10 nanometers to about 1,000 nanometers. Thicknesses outside of this range can also be used.

The cathode can comprise suitable electron injecting materials, such as metals, including high work function components, such as metals with, for example, a work function from about 4 eV to about 6 eV, or low work function components, such as metals with, for example, a work function of from about 2 eV to about 4 eV. The cathode can comprise a combination of a low work function (less than about 4 eV) metal and at least one other metal. Effective proportions of the low work function metal to the second or other metal are from less than about 0.1 weight percent to about 99.9 weight percent. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are preferred low work function metals. The Mg—Ag alloy cathodes described in U.S. Pat. Nos. 4,885,211, 4,720,432, and 5,703,436, the disclosures of which are totally incorporated herein by reference, are exemplary cathode materials for forming the cathodes. In embodiments, the cathode includes a metal-organic mixed layer (MOML) as described in U.S. Patent Application Publication 2002/0180349 A1, which is incorporated herein by reference in its entirety. Other exemplary cathodes are described in U.S. Pat. No. 5,429,884, the disclosure of which is totally incorporated herein by reference. The cathodes can be formed from lithium alloys with other high work function metals such as aluminum and indium.

Optionally, the cathode may further include a separate electron injection layer, contacting the light emitting region. Examples of suitable materials that can be used in the electron injection layer include the alkaline earth metal oxides like SrO, CaO, BaO, $Li_2O$ and others such as those disclosed in U.S. Pat. Nos. 5,457,565 and 5,739,635, which are each incorporated herein by reference in their entirety, and other metal oxides such as $Al_2O_3$, SiO and $SiO_2$. A preferred class of metal compounds that can be utilized in the electron injection layer is the alkaline metal halides such as, for example, LiF, LiCl, NaCl, KF, KCl, CsF, and others disclosed in the above referenced U.S. Pat. No. 5,739,635 and also those disclosed in U.S. Pat. No. 5,776,622, the disclosures of which are totally incorporated herein by reference.

A substantially transparent, light transmissive cathode can comprise very thin substantially transparent metallic layer or layers comprising a metal with a work function ranging from about 2 eV to about 4 eV, such as Mg, Ag, Al, Ca, In, Li, Ba, Cs and their alloys such as Mg:Ag alloys, comprised of, for example, from about 80 to 95 volume percent of Mg and about 20 to about 5 volume percent of Ag, and Li:Al alloys, comprised of, for example, from about 90 to 99 volume percent of Al, and from about 10 to about 1 volume percent of Li, and the like, having a thickness, for example, from about 10 Å to about 200 Å, and, particularly, from about 30 Å to about 100 Å. Of course, a thickness outside of this range can also be used.

In embodiments of the OLED, the cathode can be opaque (i.e., non-light transmissive) where the anode is light transmissive. Such an opaque cathode is fabricated from the materials described herein and having a thickness ranging for example from about 50 nm to about 2 mm.

Light Emitting Region

1. Electroluminescent Material and Charge Transport Material

The light emitting region is composed of an organic electroluminescent material, and optionally other materials described herein, wherein the light emitting region contains one, two, or more layers. One layer of the light emitting region is the electroluminescent layer which includes one, two, or more organic electroluminescent materials.

Where there are present in a layer two or more organic electroluminescent materials, each organic electroluminescent material may be present at any suitable volume ratio such as for example from about 99(first material):1(second material) to about 1(first material):99(second material).

Suitable organic electroluminescent materials include, for example, polyphenylenevinylenes, such as poly(p-phenylenevinylene) ("PPV"), poly(2-methoxy-5-(2-ethylhexyloxy) 1,4-phenylenevinylene) ("MeHPPV") and poly(2,5-dialkoxyphenylenevinylene) ("PDMeOPV"), and other materials disclosed in U.S. Pat. No. 5,247,190, which is incorporated herein by reference in its entirety; polyphenylenes, such as poly(p-phenylene) ("PPP"), ladder-poly-para-phenylene ("LPPP"), and poly(tetrahydropyrene) ("PTHP"); and polyfluorenes, such as poly(9,9-di-n-octylfluorene-2,7-diyl), poly (2,8-(6,7,12,12-tetraalkylindenofluorene) and copolymers containing fluorenes such as fluorene-amine copolymers (see e.g., Bernius et al., "Developmental Progress of Electroluminescent Polymeric Materials and Devices," Proceedings of SPIE Conference on Organic Light Emitting Materials and Devices III, Denver, Colo., July 1999, Volume 3797, p. 129).

Another class of suitable organic electroluminescent materials includes, but is not limited to, the metal oxinoid compounds as disclosed in U.S. Pat. Nos. 4,539,507; 5,151,629; 5,150,006; 5,141,671 and 5,846,666, each incorporated herein by reference in its entirety. Illustrative examples include tris(8-hydroxyquinolinate) aluminum ("AlQ3"), which is one preferred example, and bis(8-hydroxyquinolato)-(4-phenylphenolato) aluminum ("Balq") which is another preferred example. Other examples of this class of materials include tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h]quinolinate) beryllium, and the like, and metal thioxinoid compounds disclosed in U.S. Pat. No. 5,846,666 (which is incorporated herein by reference in its entirety), such as metal thioxinoid compounds of bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Preferred materials are bis(8-quinolinethiolato)zinc, bis(8-quinolinethiolato)cadmium, tris(8-quinolinethiolato)gallium, tris(8-quinolinethiolato)indium and bis[benzo {f}-8-quinolinethiolato]zinc.

More specifically, a class of suitable organic electroluminescent materials comprises stilbene derivatives, such as those disclosed in U.S. Pat. No. 5,516,577, incorporated herein by reference in it entirety. A preferred stilbene derivative is 4,4'-bis(2,2-diphenylvinyl)biphenyl.

Another class of suitable organic electroluminescent materials is the oxadiazole metal chelates disclosed in U.S. application Ser. No. 08/829,398, corresponding to U.S. Pat. No. 5,925,472, which is incorporated herein by reference in its entirety. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato] beryllium; bis[5-biphenyl-2-(2-hydroxyphenyl)-1,3,4-oxadiazolato]zinc; bis[5-biphenyl-2-(2-hydroxyphenyl)-1,3, 4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis [2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato] beryllium; bis[5-(4-chlorophenyl)-2-(2-hydroxyphenyl)-1,3, 4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato] zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis [2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato] beryllium, and the like; and the triazines including those disclosed in U.S. application Ser. No. 09/489,144, filed on Jan. 21, 2000 and U.S. Pat. No. 6,057,048, each incorporated herein in its entirety.

A blue organic electroluminescent material is described herein and may be for example a polyfluorene such as those mentioned above, an anthracene derivative, such as, those described, for example, in U.S. Pat. Nos. 6,479,172, 6,562, 485, 6,465,115, and 6,565,996, like 9,10-diphenylanthracene ("DPA"), 9,10-bis[4-(2,2-diphenylethenyl)phenyl]anthracene ("ADN"), and tertiary-butyl substituted 9,10-bis[4-(2,2-diphenylethenyl)phenyl]anthracene ("TBADN" also sometimes given the acronym "BH2"), a stilbene derivative such as those described above, a triazine derivative, such as those described in U.S. Pat. No. 6,229,012, a carbazole derivative including bicarbazole derivatives, or a binaphtyl derivative, such as those described in U.S. application Ser.

No. 10/774,577, filed Feb. 10, 2004, the disclosures of the cited patents and application being totally incorporated herein by reference.

A red organic electroluminescent material is described herein and may be for example a polyfluorene, such as those mentioned above, a poly phenylene vinylene, such as MeH-PPV, or others as described above. In embodiments, certain red emitting OLEDs utilize an electroluminescent material that by itself would emit green or blue, but is doped with one or two red luminescent materials.

A green organic electroluminescent material is described herein and may be for example, a polyfluorene, as those described above, a poly phenylenevinylene as those described above, or a metal chelate such as tris(8-hydroxyquinoline) aluminum ("AlQ3"), or others as those described above. In embodiments, certain green emitting OLEDs utilize an electroluminescent material that by itself would emit blue, but is doped with one or two green luminescent materials.

The light emitting region (in the electroluminescent layer and/or other layer(s) of the light emitting region) can further include from about 0.01 weight percent to about 25 weight percent of a luminescent material as a dopant. In embodiments, the dopant is an organic luminescent material including but not limited to electroluminescent materials of the type described herein, where the organic luminescent dopant may be for instance an organometallic compound. Examples of dopant materials that can be utilized in the light emitting region are fluorescent materials, such as, for example, coumarin, dicyanomethylene pyranes, polymethine, oxabenzanthrane, xanthene, pyrylium, carbostyl, perylene, and the like. Another preferred class of fluorescent materials are quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like as disclosed in U.S. Pat. Nos. 5,227,252; 5,276,381 and 5,593,788, each incorporated herein in its entirety. Another class of fluorescent materials that may be used is fused ring fluorescent dyes. Exemplary suitable fused ring fluorescent dyes include perylene, rubrene, anthracene, coronene, phenanthrecene, pyrene and the like, as disclosed in U.S. Pat. No. 3,172,862, which is incorporated herein by reference in its entirety. Also, fluorescent materials include butadienes, such as 1,4-diphenylbutadiene and tetraphenylbutadiene, and stilbenes, and the like, as disclosed in U.S. Pat. Nos. 4,356,429 and 5,516,577, each incorporated herein by reference in its entirety. Other examples of fluorescent materials that can be used are those disclosed in U.S. Pat. No. 5,601,903, which is incorporated herein by reference in its entirety.

Additionally, luminescent dopants are the fluorescent dyes disclosed in U.S. Pat. No. 5,935,720 (which is incorporated herein by reference in its entirety), such as, for example, 4-(dicyanomethylene)-2-I-propyl-6-(1,1,7,7-tetramethyljulolidyl-9-enyl)-4H-pyran (DCJTB); the lanthanide metal chelate complexes, such as for example, tris(acetylacetonato) (phenanthroline) terbium, tris(acetyl acetonato)(phenanthroline) europium, and tris(thenoyl trisfluoroacetonato)(phenanthroline) europium, and those disclosed in Kido et al., "White light emitting organic electroluminescent device using lanthanide complexes," Jpn. J. Appl. Phys., Volume 35, pp. L394-L396 (1996), which is incorporated herein by reference in its entirety; and phosphorescent materials, such as, for example, organometallic compounds containing heavy metal atoms that lead to strong spin-orbit coupling, such as those disclosed in Baldo et al., "Highly efficient organic phosphorescent emission from organic electroluminescent devices," Letters to Nature, Volume 395, pp. 151-154 (1998), which is incorporated herein by reference in its entirety. Examples include 2,3,7,8,12,13,17,18-octaethyl-21H23H-phorpine platinum(II) (PtOEP) and fac tris(2-phenylpyridine)iridium (Ir(ppy)3).

A light emitting region that generates white light can, for example, comprise two or more layers where at least one layer generates blue emission and at least one layer generates yellow, orange or red emission. The one or more layers generating blue emission can, for example, comprise one or more of the blue electroluminescent materials described herein, and the one or more layers generating the yellow, orange or red emission can be comprised of any electroluminescent material capable of emission at the desired color range or by adding luminescent dopants, as those described herein, in a suitable electroluminescent material. Alternatively, a white emitting region that generates white light can consist of a single layer comprised of a blue electroluminescent material that further includes a yellow, orange or red luminescent dopant in a low concentration, for example less than about 2% by volume, and typically, less than about 1% by volume, and sometimes even less than about 0.5% by volume, where the low concentration of dopant allows the partial retention of blue emission from the blue electroluminescent material, which when combined with the yellow, orange or red emission components from the dopant, gives the white emission.

In embodiments, the light emitting region optionally further includes one, two, or more charge transport materials (in the electroluminescent layer and/or other layer(s) of the light emitting region). Where there are present in a layer two or more charge transport materials, each charge transport material may be present at any suitable volume ratio such as for example from about 99(first material):1(second material) to about 1 (first material):99 (second material). For two or more charge transport materials, each may transport the same or different charge type (that is, whether holes or electrons). The volume ratio of the electroluminescent material and the charge transport material ranges for example from about 99(electroluminescent material):1(charge transport material) to about 1(electroluminescent material):99(charge transport material), or 90(electroluminescent material):10(charge transport material) to about 90(electroluminescent material): 10(charge transport material), or 60(electroluminescent material):40(charge transport material) to about 40(electroluminescent material):60(charge transport material).

It is understood that an electroluminescent material inherently possesses a certain degree of charge transport capability. In embodiments of the present invention, if a material is electroluminescent, then such a material is considered an electroluminescent material regardless of its charge transport capability (whether holes or electrons).

Examples of hole-transporting materials that can be utilized in the light emitting region include polypyrrole, polyaniline, poly(phenylene vinylene), polythiophene, polyarylamine as disclosed in U.S. Pat. No. 5,728,801, which is incorporated herein by reference in its entirety, and their derivatives, and known semiconductive organic materials like porphyrin derivatives such as 1,10,15,20-tetraphenyl-21H, 23H-porphyrin copper (II) disclosed in U.S. Pat. No. 4,356, 429, incorporated herein by reference in its entirety; copper phthalocyanine, copper tetramethyl phthalocyanine; zinc phthalocyanine; titanium oxide phthalocyanine; magnesium phthalocyanine; and the like.

A specific class of hole transporting materials are the aromatic tertiary amines such as those disclosed in U.S. Pat. No. 4,539,507, which is incorporated herein by reference in its entirety. Suitable exemplary aromatic tertiary amines include, but are not limited to, bis(4-dimethylamino-2-methylphenyl)phenylmethane, N,N,N-tri(p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, N,N'-di(naphthalene-1-yl)-N,N'-diphenyl-benzidine ("NPB"), mixtures thereof and the like. Another class of aromatic tertiary amines are polynuclear aromatic amines. Examples of these polynuclear aromatic amines include, but are not limited to, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9-carbazolyl)-1,1'-biphenyl compounds, such as, for example 4,4'-bis(9-carbazolyl)-1,1'-biphenyl and 4,4'-bis(3-methyl-9-carbazolyl)-1,1'-biphenyl, and the like.

A specific class of the hole transporting materials are the indolo-carbazoles, such as those disclosed in U.S. Pat. Nos. 5,942,340 and 5,952,115, each incorporated herein by reference in its entirety, such as, for example, 5,11-di-naphthyl-5,11-dihydroindolo[3,2-b]carbazole, and 2,8-dimethyl-5,11-di-naphthyl-5,11- -dihydroindolo[3,2-b]carbazole; N,N,N'N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N'N'-tetraarylbenzidine are N,N;-di-1-naphthyl-N,N'-diphenyl-1,1'-biphenyl-4,4'-diamine, which is more preferred; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. Preferred hole transporting materials are the naphtyl-substituted benzidine derivatives.

In embodiments, the light emitting region can also include one or more electron transport materials. Exemplary electron transport materials include polyfluorenes, such as poly(9,9-di-n-octylfluorene-2,7-diyl), poly(2,8-(6,7,12,12-tetraalkyl-indenofluorene) and copolymers containing fluorenes such as fluorene-amine copolymers, as described in Bernius et al., Proceedings of SPIE Conference on Organic Light Emitting Materials and Devices III, Denver, Colo., July 1999, Volume 3797, p. 129, the disclosure of which is totally incorporated herein by reference.

Other examples of electron transport materials are the metal oxinoid compounds, the oxadiazole metal chelate compounds, the triazine compounds and the stilbene compounds, examples of which have been described above in detail. Other examples of electron transport materials are the arylimidazole derivatives such as those described in U.S. application Ser. No. 10/702,859, filed Nov. 6, 2003, the disclosure of which is totally incorporated herein by reference.

In embodiments where the light emitting region includes a hole transport material and/or electron transport material in addition to the organic electroluminescent material, the organic electroluminescent material, the hole transport material, and/or the electron transport material can be formed in separate layers, such as, for example, the OLEDs disclosed in U.S. Pat. Nos. 4,539,507; 4,720,432 and 4,769,292; or in the same layer thus forming a mixed layer of two or more materials, such as, for example, the OLEDs disclosed in U.S. Pat. No. 6,130,001, and in U.S. application Ser. Nos. 09/357,551 (corresponding to U.S. Pat. No. 6,392,339); 09/606,670 (corresponding to U.S. Pat. No. 6,392,250); and 09/770,159 (corresponding to U.S. Pat. No. 6,614,175). The disclosures of these patents are incorporated herein by reference in their entirety.

In embodiments where the electroluminescent layer includes both an organic electroluminescent material and a charge transport material, such a layer may be referred to as a mixed electroluminescent layer.

2. Electron Accepting Layer

In embodiments, the electron accepting layer containing the electron accepting material may be considered a hole injection layer which reduces the hole injection barrier between the anode capping layer and the electroluminescent layer. In embodiments, the electron accepting layer contacts the electroluminescent layer. The electron accepting layer may be composed of one, two, or more electron accepting materials. Where the electron accepting layer includes two or more electron accepting materials, each electron accepting material may be present at any suitable volume ratio such as for example from about 99(first material):1(second material) to about 1(first material):99(second material).

The inclusion of the electron accepting layer may, in some embodiments, lower the driving voltage of the OLED and/or increase device efficiency relative to a comparison device that is in all regards identical except for the omission of the electron accepting layer.

Suitable electron accepting materials include a wide variety of compounds that have a high electron affinity. Suitable organic electron accepting materials include electron deficient compounds such as, for example as described in U.S. Patent Application Publication 2004/0004433 by Lamansky et al., the disclosure of which is totally incorporated herein by reference, tetracyanoquinodimethane compounds where this term collectively refers to tetracyanoquinodimethane and its derivatives; thiopyranylidine compounds where this term collectively refers to thiopyranylidine and its derivatives; polynitrofluorenone compounds where this term collectively refers to polynitrofluorenone and its derivatives; tetracyanoethylene compounds where this term collectively refers to tetracyanoethylene (TCNE) and its derivatives; chloranil compounds where this term collectively refers to chloranil and its derivatives; and other compounds commonly used as electron acceptors. Specific examples of electron accepting materials include tetracyanoquinodimethane (TCNQ), tetrafluoro-tetracyanoquinodimethane (F4TCNQ), tetracyanoethylene, chloranil, 2-(4-(1-methylethyl)phenyl-6-phenyl-4H-thiopyran-4-ylidene)-propanedinitrile-1,1-dioxyide (PTYPD), and 2,4,7-trinitrofluorenone. Other possible organic electron accepting materials could be those described in U.S. Patent Application Publication 2004/0009418 by Main et al., the disclosure of which is totally incorporated herein by reference, such as carboxylfluorenone malonitrile compounds where this term collectively refers to carboxylfluorenone malonitrile (CFM) and its derivatives; N,N'bis(dialkyl)-1,4,5,8-naphthalenetetracarboxylic diimide compounds where this term collectively refers to N,N'bis(dialkyl)-1,4,5,8-naphthalenetetracarboxylic diimide and its derivatives; or N,N'bis(diaryl)-1,4,5,8-naphthalenetetracarboxylic diimide compounds where this term collectively refers to N,N'bis(diaryl)-1,4,5,8-naphthalenetetracarboxylic diimide and its derivatives; carboxybenzylnaphthaquinone compounds where this term collectively refers to carboxybenzylnaphthaquinone and its derivatives; or diphenoquionone compounds where this term collectively refers to diphenoquionone and its derivatives. The electron accepting material can also be inorganic compounds such as Lewis acid compounds like $FeCl_3$, $AlCl_3$, $InCl_3$, $SbCl_5$, $GaCl_3$ etc, as reported by Endo et al. in *Jpn. J. Appl Phys.* 41, L358 (2002), the disclosure of which is totally incorporated herein by reference. Other electron accepting materials can be fullerene compounds where this term collectively refers to fullerene (e.g., $C_{60}$) and its derivatives.

In embodiments, the electron accepting layer optionally further includes one, two, or more organic materials. Where there are present two or more organic materials, each organic material may be present at any suitable volume ratio such as for example from about 99(first material):1(second material) to about 1(first material):99(second material). The volume ratio of the organic material and the charge accepting material ranges for example from about 99(organic material):1(charge accepting material) to about 1 (organic material):99(charge accepting material), particularly from about 90(organic material):10(charge accepting material) to about 10(organic material):90(charge accepting material).

Suitable organic materials include for example hole transport materials, such as tertiary aromatic amine derivatives, indolocarbazole derivatives, and porphyrin derivatives, including copper phthalocyanine, copper tetramethyl phthalocyanine; zinc phthalocyanine; titanium oxide phthalocyanine; magnesium phthalocyanine; and the like, such as those described above. Other suitable materials include polypyrrole, polyaniline, poly(phenylene vinylene), polythiophene, polyarylamine.

The thickness of the light emitting region, and the thickness of each layer (e.g., electroluminescent layer, hole transport layer, electron transport layer, and electron accepting layer) of the light emitting region, can vary from for example, about 1 nm to about 1000 nm, typically from about 5 nm to about 200 nm, and especially from about 10 nm to about 150 nm.

Anode Capping Region
1. Anode Capping Layer(s)

In embodiments, the anode capping layer(s) is intended to enhance one or more properties of the present OLEDs such as for example to increase the luminance stability. In embodiments, the anode capping layer contacts either the electron accepting layer or the anode, or both the electron accepting layer and the anode. In embodiments, the anode capping layer(s) is composed for example of one, two, three or more suitable materials, whether organic and/or inorganic. Where the anode capping layer(s) is composed of two or more inorganic materials, each inorganic material may be present at any suitable volume ratio such as for example from about 99(first material):1(second material) to about 1(first material):99(second material).

Suitable inorganic materials for the anode capping layer(s) include for instance inorganic metal containing materials and inorganic materials which do not contain a metal. Exemplary inorganic materials which do not contain a metal are for example C, Ge, Si, SiO, $SiO_2$, or $Si_3N_4$.

Exemplary inorganic metal containing materials include for example:
 metal oxides (e.g., MgO, $Li_2O$, CaO, $Cs_2O$, $Al_2O_3$, $In_2O_3$, $Cr_2O_3$, CuO, $Cu_2O$, ZnO, $ZrO_2$ and $SnO_2$);
 metal hydroxides (e.g., $Mg_2(OH)$, $Ca_2(OH)$, LiOH, KOH, $Cr(OH)_3$ and NaOH);
 metal halides, (e.g., LiF, CsF, $MgF_2$, KF, and $FeCl_3$);
 metal sulfides (e.g., ZnS);
 metal nitrides (e.g., TiSiN and TaN);
 metal suicides (e.g., WSi);
 elemental metals (e.g., Mg, Cr, Au, Ni, Ta, Cu, Ti, Pd and Pt); and
 metal alloys (e.g., Mg—Ag alloys, Li—Al alloys, Au—Pd alloys, Au—Pt alloys, Pt—Pd alloys and Pd—Ag alloys).

The metal alloys may be composed of two, three or more metals where the metals may be in any suitable volume ratio such as for example from about 99(first metal):1(second metal) to about 1(first metal):99(second metal), particularly from about 90(first metal):10(second metal) to about 10(first metal):90(second metal).

In embodiments, the anode capping region encompasses the optional presence of an organic material (whether one, two, or more organic materials). In one embodiment, the organic material(s) is an additional component of an anode capping layer, in addition to the inorganic material(s). In another embodiment where there are two or more anode capping layers, at least one of the anode capping layers can include the organic material(s) without any inorganic material and at least one of the anode capping layers includes the inorganic material(s) and optionally the organic material(s).

When there are present in an anode capping layer two or more organic materials, each organic material may be present at any suitable volume ratio such as for example from about 99(first material):1(second material) to about 1(first material):99(second material). The volume ratio of the organic material and the inorganic material ranges for example from about 99(organic material):1(inorganic material) to about 1(organic material):99(inorganic material), particularly from about 90(organic material):10(inorganic material) to about 10(organic material):90(inorganic material).

Suitable organic materials for the anode capping region include for example hole transport materials such as tertiary aromatic amine derivatives, indolocarbazole derivatives, and porphyrin derivatives, including copper phthalocyanine, copper tetramethyl phthalocyanine; zinc phthalocyanine; titanium oxide phthalocyanine; magnesium phthalocyanine; and the like such as those described herein. Other suitable hole transport materials include polypyrrole, polyaniline, poly(phenylene vinylene), polythiophene, and polyarylamine. The organic materials for the anode capping region can also include, for example, electron transport materials, such as those described herein such as for example a metal chelate or a triazine.

In embodiments involving two or more anode capping layers, the anode capping layers may be the same or different from one another for each of the aspects making up the anode capping layers such as for example the material(s), the material concentration where two or more materials are present, and the layer thickness.

In embodiments, when elemental metal and/or metal alloy are used in the anode capping layer(s), there may possibly occur a partial or even total chemical transformation of the elemental metal and metal alloy to one or more metal containing compounds (e.g., a metal oxide), where the transformation may occur during, immediately after (1 hour or less) or even long after (more than 1 hour) the anode capping layer(s) is formed, possibly as a result of interaction with other materials present in the fabrication environment or with other materials in the anode capping layer(s) or the rest of the OLED.

2. Electron Accepting Layer

In embodiments, the same electron accepting layer described herein with respect to the Light Emitting Region may be designated part of the Anode Capping Region, especially when the electron accepting layer is sandwiched between two or more anode capping layers.

The anode capping layer(s) may be in any suitable sequence with the electron accepting layer.

The thickness of the anode capping region, and the thickness of each layer (e.g., anode capping layer and electron accepting layer) of the anode capping region, can vary from for example, about 0.1 nm to about 100 nm, typically from about 0.5 nm to about 50 nm, and especially from about 0.5 nm to about 15 nm.

Embodiments of this invention include an anode capping region which is transparent or translucent, and therefore the present OLEDs in embodiments are suitable for applications when transparent anode (e.g., anodes with transmission at least about 70% in the visible range, and typically at least about 90% in the visible range) such as in bottom emitting OLEDs or transparent (see-through) OLEDs is desired. In transparent or translucent embodiments of the anode capping region, the optical transmission of the anode capping region can be made to be at least about 50% in the visible range, and typically at least about 70% in the visible range, and preferably at least about 90% in the visible range, by means of using thin layers such as, for example, each layer is about 200 Angstroms or less, and preferably, each layer is about 100 Angstroms or less, such that the optical transmission of the entire anode capping region is in the desired range. These transparent embodiments are particularly suitable for anode-emitting (also sometimes called bottom emitting) OLEDs, such as, for example in passive matrix OLED displays, and some active matrix displays, when device emission is required to be transmitted through the anode, or in other applications involving transparent and/or transparent or translucent substrates (rigid transparent substrates such as glass, or flexible transparent substrates such as plastic substrates).

In embodiments, when the anode capping region is used in an OLED with a non-transparent anode, and hence maximizing its optical transmission becomes less important, thicker layer(s) of the anode capping region, for example, layer(s) in the range of about 100 Angstroms to about 2,000 Angstroms can be used, and may provide additional advantages, such as, for example, increased mechanical robustness, optical reflectivity, or electrical conduction. In embodiments, a transparent anode capping region can be used, and are sometimes even desirable, with a non-transparent anode, such as, with reflective anodes with reflectance of for example, at least about 80% in the visible range, or with non-reflective anodes, such as anodes of for example not more than about 50% reflectance in the visible range.

Anode

Any suitable anode may be used including optically transparent, translucent, opaque, reflective and non-reflective anodes. The anode is a single layer or a plurality of layers composed of for example indium tin oxide (ITO), tin oxide, gold or platinum, or a mixture thereof. Other suitable materials for forming the anode include, but are not limited to, electrically conductive carbon, π-conjugated polymers such as polyaniline, polythiophene, polypyrrole, and the like having, for example, a work function equal to, or greater than, about 4 eV, or from about 4 eV to about 6 eV. In embodiments, the anode can be ZnO-Based anodes described by Zugang et al, J. Phys. Condens. Matter 8, 3221 (1996) and by Kim et al., Appl. Phys. Lett. 83, 3809 (2003) or conducting polymer anodes like glycerol-doped poly (3,4-ethylenedioxy-thiophene)-poly(styrene sulfonate) ("PEDOT:PSS") or polyaniline ("PANI") as described by Kim et al., Appl. Phys. Lett. 80, 3844 (2002) and by Carter et al. Appl. Phys. Lett. 70, 2067 (1997), the disclosures of which are totally incorporated herein by reference.

The anode can have any suitable form. A thin conductive layer can be coated onto a light transmissive substrate, such as, for example, a transparent or substantially transparent glass plate or plastic film. Embodiments of organic light emitting devices can comprise a light transmissive anode formed from tin oxide or indium tin oxide coated on glass. Also, very thin light-transparent metallic anodes having a thickness, for example, of less than about 200 Å, and, especially, from about 75 Å to about 150 Å can be used. These thin anodes can comprise metals such as gold, palladium and the like. In addition, transparent or semi-transparent thin layers of conductive carbon or conjugated polymers such as polyaniline, polythiophene, polypyrrole and the like can be used to form anodes. These thin layers can have a thickness of, for example from 50 Å to about 175 Å. Additional suitable forms of the anode are disclosed in U.S. Pat. No. 4,885,211, which is incorporated herein by reference in its entirety. In embodiments, the anode includes a metal-organic mixed layer (MOML) as described in U.S. Patent Application Publication 2002/0180349 A1, the disclosure of which is totally incorporated herein by reference.

In embodiments of a light transmissive anode, the thickness of the anode can range for example from about 1 nm to about 5000 nm or from 30 nm to about 300 nm. The thickness range of the anode is dependent on the optical constants of the anode material.

In embodiments of the OLED, the anode can be opaque (i.e., non-light transmissive or non-transparent). Such an opaque anode is fabricated from the materials described herein and having a thickness ranging for example from about 10 nm to about 2 mm. Non-transparent anodes can comprise for example Si, Ni, Au, Ag, Cu and/or Pt, which may also be highly reflective as described, for example, in Chen et al. Appl. Phys. Lett. 83, 5127 (2003), or non-reflective as described, for example, in U.S. Patent Application Publication 2002/0180349 A1, the disclosure of which is totally incorporated herein by reference. Embodiments of the present OLED with a non-transparent anode include cathode-emitting OLEDs (e.g., OLEDs with transparent cathodes, where cathode transmission is at least about 70%, in the visible range, and typically, is at least about 80% in the visible range; also sometimes called top-emitting OLEDs) commonly used in active-matrix OLED displays, and others.

Substrate

The substrate may be rigid or flexible and may be composed of one, two, three or more layers. The substrate may have a thickness ranging for example from about 10 to about 5,000 micrometers, and more particularly from about 25 to about 1,000 micrometers.

A substantially transparent substrate can comprise various suitable materials including, for example, polymeric components, glass, quartz and the like. Suitable polymeric components include, but are not limited to polyesters such as MYLAR®, polycarbonates, polyacrylates, polymethacrylates, polysulfones, and the like. Other substrate materials can also be selected provided, for example, that the materials can effectively support the other layers, and do not interfere with the device functional performance.

An opaque substrate can comprise various suitable materials including, for example, polymeric components like polyesters such as MYLAR®, polycarbonates, polyacrylates, polymethacrylates, polysulfones, and the like, which contain coloring agents or dyes such as carbon black. The substrate can also be comprised of silicon such as amorphous silicon, polycrystalline silicon, single crystal silicon, and the like. Another class of materials that can be used in the substrate are ceramics such as metallic compounds like metal oxides, halides, hydroxides, sulfides and others.

In embodiments, the present OLED uses a conductive substrate such as amorphous-Si, poly-Si, or flexible metallic foils and belts (e.g., stainless steel belts or Ni belts).

Exemplary configurations of the present OLEDs are now described where the various configurations have the recited sequence. In embodiments, one or both of the cathode and anode are light transmissive.

Configuration 1:
cathode
electron transport layer (light emitting region)
electroluminescent layer (light emitting region)
hole transport layer (light emitting region)
electron accepting layer (light emitting region)
second anode capping layer including organic material (anode capping region)
first anode capping layer including inorganic material (anode capping region)
anode
substrate Configuration 2:
cathode
electron transport layer (light emitting region)
electroluminescent layer (light emitting region)
hole transport layer (light emitting region)
electron accepting layer (light emitting region)
anode capping layer including inorganic material (anode capping region)
anode
substrate Configuration 3:
cathode
electron transport layer (light emitting region)
electroluminescent layer (light emitting region)
hole transport layer (light emitting region)
electron accepting layer (light emitting region)
third anode capping layer including organic material (anode capping region)
second anode capping layer including inorganic material (anode capping region)
first anode capping layer including organic material (anode capping region)
anode
substrate Configuration 4:
cathode
electron transport layer (light emitting region)
electroluminescent layer (light emitting region)
hole transport layer (light emitting region)
second anode capping layer including organic material (anode capping region)
electron accepting layer (anode capping region)
first anode capping layer including inorganic material (anode capping region)
anode
substrate Configuration 5:
cathode
electron transport layer (light emitting region)
electroluminescent layer (light emitting region)
hole transport layer (light emitting region)
electron accepting layer (light emitting region)
fifth anode capping layer including inorganic material (anode capping region)
fourth anode capping layer including organic material (anode capping region)
third anode capping layer including inorganic material (anode capping region)
second anode capping layer including organic material (anode capping region)
first anode capping layer including inorganic material (anode capping region)
anode
substrate Configuration 6:
cathode
electron transport layer (light emitting region)
electroluminescent layer (light emitting region)
hole transport layer (light emitting region)
electron accepting layer (light emitting region)
third anode capping layer including inorganic material (anode capping region)
second anode capping layer including organic material (anode capping region)
first anode capping layer including inorganic material (anode capping region)
anode
substrate Configuration 7:
cathode
electron transport layer (light emitting region)
electroluminescent layer (light emitting region)
hole transport layer (light emitting region)
electron accepting layer (light emitting region)
second anode capping layer including inorganic material (anode capping region)
first anode capping layer including organic material (anode capping region)
anode
substrate Configuration 8:
cathode
electron transport layer (light emitting region)
electroluminescent layer (light emitting region)
hole transport layer (light emitting region)
electron accepting layer (light emitting region)
fourth anode capping layer including organic material (anode capping region)
third anode capping layer including inorganic material (anode capping region)
second anode capping layer including organic material (anode capping region)
first anode capping layer including inorganic material (anode capping region)
anode
substrate Configuration 9:
cathode
electron transport layer (light emitting region)
electroluminescent layer (light emitting region)
hole transport layer (light emitting region)
electron accepting layer (light emitting region)

second anode capping layer including inorganic material (anode capping region)
first anode capping layer including inorganic material (anode capping region)
anode
substrate The layers of the present OLEDs can be formed by any suitable technique. There can be employed various thin film forming methods such as, for example, thermal vapor deposition in vacuum. Electron beam deposition and sputtering deposition are also among the suitable vacuum deposition methods. Chemical vapor deposition can also be used as a deposition method. The deposition rate of the various materials can be for example about 0.1 to about 100 Angstroms per second ("A/s"), or from about 1 to about 10 A/s. In some cases it is possible to form one or more OLED layers by spin coating, printing (e.g., inkjet printing) or other coating techniques.

For embodiments of the present OLEDs, the following exemplary luminance stability values (half-life with $L_o$ of about 100 cd/m$^2$) are provided:

Blue light emitting OLEDs: at least about 2,000 hours, at least about 4,000 hours, or at least about 6,000 hours.

Green light emitting OLEDs: at least about 5,000 hours, at least about 10,000 hours, or at least about 15,000 hours.

Red light emitting OLEDs: at least about 2,000 hours, at least about 4,000 hours, or at least about 6,000 hours.

White light emitting OLEDs: at least about 4,000 hours, at least about 8,000 hours, or at least about 12,000 hours.

In embodiments, the anode capping layer(s) is selected such that the luminance stability ratio of the present OLEDs is any suitable value such as for example greater than 1, greater than about 2, greater than about 5, or greater than about 10. The luminance stability ratio refers to the ratio between (1) the time of operation elapsed before the luminance of the present OLED containing the anode capping layer(s) drops by a certain factor (e.g., 10%, 20%, 50%, etc.) of the initial luminance $L_o$ (where, for example, $L_o$=100 cd/m$^2$, 300 cd/m$^2$, 500 cd/M$^2$, or 1000 cd/m$^2$), and (2) the time of operation elapsed before the luminance of a comparison OLED (which is in all respects identical except for the absence of the anode capping layer(s)) drops by the same factor when operated at the same initial luminance $L_o$, under the same testing conditions, where the test can be performed anytime after the known initial burn-in period of the devices. In embodiments, for the present OLEDs at a given initial luminance $L_0$, the luminance stability ratio may or may not significantly vary depending on the particular luminance dropoff factor chosen (e.g., the stability ratio measured at 10% dropoff factor may or may not significantly differ from the stability ratio measured at 50%). In certain embodiments, the luminance stability ratio will be relatively consistent regardless of the particular dropoff factor used (i.e., in embodiments, the luminance stability ratio is relatively independent of the particular dropoff factor used). For those embodiments where the luminance stability ratio is dependent on the particular dropoff factor used and it is important to precisely determine the luminance stability ratio, the dropoff factor of 10% should be used. This dropoff factor of 10% is picked to enable a faster determination, as compared with the length of time required for a dropoff factor of 50% (half-life).

For those embodiments where the luminance stability ratio is dependent on the particular initial luminance $L_o$ used and it is important to precisely determine the luminance stability ratio, the following initial luminance $L_o$ should be used (all using AC driving at an average forward current density of about 31.25 mA/cm$^2$):

Blue light emitting OLEDs: 300 cd/m$^2$;
Green light emitting OLEDs: 1,000 cd/m$^2$;
Red light emitting OLEDs: 150 cd/M$^2$; and
White light emitting OLEDs: 1,000 cd/m$^2$;

The burn-in period depends on the initial luminance of an OLED where, in general, the higher the initial luminance at which an OLED is operated, the shorter the burn-in period. For example, for an OLED operated at an initial luminance of 100 cd/m$^2$, the burn-in period is usually the first 100 hours and typically the first 500 hours of operation of the OLED; for an OLED operated at an initial luminance of 300 cd/m$^2$, the burn-in period is usually the first 35 hours and typically the first 175 hours of operation of the OLED; for an OLED operated at an initial luminance of 500 cd/m$^2$, the burn-in period is usually the first 20 hours and typically the first 100 hours of operation of the OLED; and for an OLED operated at an initial luminance of 1000 cd/m$^2$, the burn-in is usually the first 10 hours and typically the first 50 hours of operation of the OLED.

The term "selected" in the context of providing the anode capping layer(s) with the specified luminance stability ratio refers to the choices to be made for the aspects making up the anode capping layer(s) such as for example the material(s), the material concentration where two or more materials are present, the layer thickness, and the number of anode capping layers, which enable the present OLEDs to exhibit the specified luminance stability ratio. Exemplary embodiments of the anode capping layer(s) are discussed herein to illustrate "selected".

A longer time demonstrated by the present OLED before its luminance drops by a certain fraction from the same initial value relative to the comparison OLED renders the luminance stability ratio >1, and represents an increase in device luminance stability. In embodiments, the luminance stability ratio is any suitable value such as for example greater than 1, greater than about 2, greater than about 5, or greater than about 10. In embodiments, the driving voltage of the present OLED may be lower than, the same as, or higher than the driving voltage needed to achieve the same level of current density and/or luminance of a comparison OLED that is in all regards identical except for the omission of the anode capping layer(s). In embodiments, the driving voltage of the present OLED is not significantly higher (i.e., does not exceed by more than about 5 Volts, or does not exceed by more than about 3 Volts) than the driving voltage needed to achieve the same level of current density and/or luminance of the comparison OLED that is in all regards identical except for the omission of the anode capping layer(s).

The term "about" as used for values of the luminance stability ratio refers to a deviation for example up to 10% lower than the recited numerical value. For example, a luminance stability ratio that is greater than about 2 includes 2, any value greater than 2, and certain values smaller than 2 such as 1.80, 1.85, 1.90, 1.91, 1.92 and the like.

In embodiments, the present OLEDs may exhibit one or more of the following attributes relative to a comparison OLED that is in all regards identical except for the omission of the anode capping layer(s): more stable luminance; and more stable driving voltage.

The invention will now be described in detail with respect to specific exemplary embodiments thereof, it being understood that these examples are intended to be illustrative only and the invention is not intended to be limited to the materials, conditions, or process parameters recited herein. All percentages and parts are by volume unless otherwise indicated.

EXAMPLES

In the Examples below, the configuration of the OLEDs is as follows: substrate/anode/anode capping layer(s)/electron accepting layer/one layer of the light emitting region/another layer of the light emitting region/cathode.

In the Examples below, where there are multiple layers indicated, the convention is that when the layers are read from left to right, the first recited layer is closer to the anode than the other layer. For example, regarding "Layers of light emitting region for Group I: NPB(600)/AlQ3(750)," the NPB layer is closer to the anode than the AlQ3 layer.

The numbers in brackets are a layer thickness in Angstroms. Numbers separated by a colon (e.g., "1:1:) indicate a material ratio by volume.

The following terms are explained:

"ITO": indium tin oxide.

"NPB": N,N'-di(naphthalene-1-yl)-N,N'-diphenyl-benzidine.

"AlQ3": tris(8-hydroxyquinolinate) aluminum; also referred to as tris(8-hydroxyquinoline) aluminum or tris(8-hydroxyquinolinato) aluminum.

"F4TCNQ": tetrafluoro-tetracyanoquinodimethane.

"CuPc": copper phthalocyanine; this organometallic compound is considered organic.

"BH2": tertiary-butyl substituted 9,10-bis[4-(2,2-diphenylethenyl)phenyl]anthracene; also represented by the acronym TBADN.

"BD2": tertiary-butyl substituted perylene.

"Rub": 5,6,11,12-tetraphenylnaphthacene; also called Rubrene.

All OLEDs of all groups (Groups I through IX) were fabricated using physical vapor deposition in vacuum (5×10−6 Torr) on ITO-coated glass substrates, that were pre-cleaned using UV-ozone cleaning. All devices had identical anodes which were ITO having a thickness of about 200 nm. All devices had identical cathodes composed of Mg and Ag (9:1 volume ratio) having a thickness of about 120 nm.

Unless otherwise noted, the values provided in the column titled "Luminance Stability Ratio (vs Comp.)" were calculated based on the following:

Initial luminescence ($L_o$) using AC driving at an average forward current density of about 31.25 mA/cm$^2$;

Initial voltage ($V_o$) was within about 5V from that of the comparison example.

The luminance stability test was carried out by operating the OLEDs in a nitrogen atmosphere using AC driving at an average forward current density of about 31.25 mA/cm$^2$, and monitoring the gradual decrease in device luminance using a photodiode. Time elapsed for 10% decay from $L_o$, subsequent to the initial burn-in period of about 20 hours, was recorded. Time for 10% decay from $L_o$=100 cd/m$^2$ was calculated from time for 10% decay from $L_o$ measured above using the relationship:

$$\text{Time for 10\% decay from } L_o=100 \text{ cd/m}^2 = (\text{Time for 10\% decay from } L_o \text{ measured above}) \times (L_o \text{ measured above})/100.$$

Luminance stability ratio (vs comp.) was obtained by dividing the "Time for 10% decay from $L_o$=10 cd/m$^2$ obtained from an inventive example device" over "Time for 10% decay from $L_o$=100 cd/m$^2$ obtained from a comparison example device that was in all respects identical except for the omission of the anode capping layer(s)."

Group I Examples (Electroluminescent color: Green):
Layers of light emitting region for Group I: NPB(600)/AlQ3(750)

| Ex. # | Anode Capping Layer(s) | Electron Accepting Layer | Luminance Stability Ratio (vs Comp.) | Remarks |
|---|---|---|---|---|
| I-1 (Comp.) | None | NPB + F4TCNQ (9:1)(100) | 1 | Comparison example |
| I-2 | Au:Pd (5) | NPB + F4TCNQ (9:1)(100) | 3.5 | Large increase in luminance stability compared to comparison example |
| I-3 | Au:Pd (5)/NPB + Mg (1:1)(50) | NPB + F4TCNQ (9:1)(100) | 7.1 | Large increase in luminance stability compared to comparison example |

Group II Examples (Electroluminescent color: Green):
Layers of light emitting region for Group II: NPB(200)/NPB+AlQ3(1:1)(800)/AlQ3(200)

| Ex. # | Anode Capping Layer(s) | Electron Accepting Layer | Luminance Stability Ratio (vs Comp.) | Remarks |
|---|---|---|---|---|
| II-1 (Comp.) | None | NPB + F4TCNQ (9:1)(100) | 1 | Comparison example |
| II-2 | CuPc + Mg (1:1)(150) | NPB + F4TCNQ (9:1)(100) | 2 | Large increase in luminance stability compared to comparison example |

Group III Examples (Electroluminescent color: Green):
Layers of light emitting region for Group III: NPB(600)/AlQ3(750)

| Ex. # | Anode Capping Layer(s) | Electron Accepting Layer | Luminance Stability Ratio (vs Comp.) | Remarks |
|---|---|---|---|---|
| III-1 (Comp.) | None | NPB + F4TCNQ (9:1)(100) | 1 | Comparison example |
| III-2 | CuPc + Mg (1:1)(25) | NPB + F4TCNQ (9:1)(100) | 17.7 | Large increase in luminance stability compared to comparison example III-1 |
| III-3 | CuPc + Mg (1:1)(150) | NPB + F4TCNQ (9:1)(100) | 53.3 | Large increase in luminance stability compared to comparison example III-1 |
| III-4 | Mg (25)/CuPc (150) | NPB + F4TCNQ (9:1)(100) | 18.3 | Large increase in luminance stability compared to comparison example III-1 |
| III-5 (Comp.) | CuPc (150) | NPB + F4TCNQ (9:1)(100) | 1.1 | Marginally increased luminance stability compared to comparison example III-1. Increase in stability was much less for this comparative example (Mg absent; and only organic material in the Anode Capping Layer(s)) than compared with other examples which included Mg in the Anode Capping Layer(s). |

Group IV Examples (Electroluminescent color: Green):
Layers of light emitting region for Group IV: NPB(600)/AlQ3(750)

| Ex. # | Anode Capping Layer(s) | Electron Accepting Layer | Luminance Stability Ratio (vs Comp.) | Remarks |
|---|---|---|---|---|
| IV-1 (Comp.) | None | NPB + F4TCNQ (9:1)(100) | 1 | Comparison example |
| IV-2 | Cr (7) | NPB + F4TCNQ (9:1)(100) | 36.4 | Large increase in luminance stability compared to comparison example |
| IV-3 | Cr (7)/NPB (25)/Cr (7) | NPB + F4TCNQ (9:1)(100) | 132.6 | Large increase in luminance stability compared to comparison example |
| IV-4 | NPB (25)/Cr (7) | NPB + F4TCNQ (9:1)(100) | 27.7 | Large increase in luminance stability compared to comparison example |

Group V Examples (Electroluminescent color: Green):
Layers of light emitting region for Group V: NPB(600)/ AlQ3(750)

| Ex. # | Anode Capping Layer(s) | Electron Accepting Layer | Luminance Stability Ratio (vs Comp.) | Remarks |
|---|---|---|---|---|
| V-1 (Comp.) | None | NPB + F4TCNQ (9:1)(100) | 1 | Comparison example |
| V-2 | Mg (50) | NPB + F4TCNQ (9:1)(100) | 18.6 | Large increase in luminance stability compared to comparison example |
| V-3 | Mg (25) | NPB + F4TCNQ (9:1)(100) | 58 | Large increase in luminance stability compared to comparison example |
| V-4 | Mg (25)/NPB (25)/Mg (25) | NPB + F4TCNQ (9:1)(100) | 17.5 | Large increase in luminance stability compared to comparison example |

Group VI Examples (Electroluminescent color: Green):
Layers of light emitting region for Group VI: NPB(600)/ AlQ3(750)

| Ex. # | Anode Capping Layer(s) | Electron Accepting Layer | Luminance Stability Ratio (vs Comp.) | Remarks |
|---|---|---|---|---|
| VI-1 (Comp.) | None | NPB + F4TCNQ (9:1)(100) | 1 | Comparison example |
| VI-2 (Comp.) | Ag (7) | NPB + F4TCNQ (9:1)(100) | 0.36 | Decreased luminance stability compared to comparison example VI-1. Illustrates that not every Anode Capping Layer can result in increased luminance stability. |
| VI-3 (Comp.) | Ag (25) | NPB + F4TCNQ (9:1)(100) | 0.25 | Decreased luminance stability compared to comparison example VI-1. Illustrates that not every Anode Capping Layer can result in increased luminance stability. |
| VI-4 (Comp.) | Ag + NPB (1:1) (50) | NPB + F4TCNQ (9:1)(100) | 0.25 | Decreased luminance stability compared to comparison example VI-1. Illustrates that not every Anode Capping Layer can result in increased luminance stability. |
| VI-5 (Comp.) | Sm (5) | NPB + F4TCNQ (9:1)(100) | N/A (unable to determine stability ratio due to poor performance) | Decreased luminance stability compared to comparison example VI-1. Illustrates that not every Anode Capping Layer can result in increased luminance stability. |

Group VII Examples (Electroluminescent color: Blue):
Layers of light emitting region for Group VII: NPB(300)/
NPB+BH2+BD2(49:49:2)(300)/BH2(50)/AlQ3(250)

| Ex. # | Anode Capping Layer(s) | Electron Accepting Layer | Luminance Stability Ratio (vs Comp.) | Remarks |
|---|---|---|---|---|
| VII-1 (Comp.) | None | NPB + F4TCNQ (9:1)(100) | 1 | Comparison example |
| VII-2 | NPB + Mg (1:1)(10) | NPB + F4TCNQ (9:1)(100) | 4.9 | Large increase in luminance stability compared to comparison example |
| VII-3 | NPB + Mg (1:1)(50) | NPB + F4TCNQ (9:1)(100) | 6.25 | Large increase in luminance stability compared to comparison example |

Group VIII Examples (Electroluminescent color: Blue):
Layers of light emitting region for Group VIII: NPB(300)/
BH2 (300) AlQ3(300)

| Ex. # | Anode Capping Layer(s) | Electron Accepting Layer | Luminance Stability Ratio (vs Comp.) | Remarks |
|---|---|---|---|---|
| VIII-1 (Comp.) | None | NPB + F4TCNQ (9:1)(100) | 1 | Comparison example |
| VIII-2 (Comp.) | CuPc (150) | NPB + F4TCNQ (9:1)(100) | 1.3 | Marginally increased luminance stability compared to comparison example VIII-1. Increase in stability was much less for this comparative example (Mg absent; and only organic material in the Anode Capping Layer(s)) than compared with Example VIII-5 which included Mg in the Anode Capping Layer(s). |
| VIII-3 (Comp.) | NPB (150) | NPB + F4TCNQ (9.1)(100) | 1.5 | Marginally increased luminance stability compared to comparison example VIII-1. Increase in stability was much less for this comparative example (Mg absent; and only organic material in the Anode Capping Layer(s)) than compared with Example VIII-5 which included Mg in the Anode Capping Layer(s). |
| VIII-4 (Comp.) | NPB + Ag (1:1)(50) | NPB + F4TCNQ (9:1)(100) | 0.38 | Decreased luminance stability compared to comparison example VIII-1. Illustrates that not every Anode Capping Layer can result in increased stability. |
| VIII-5 | NPB + Mg + Ag (48:48:4)(50) | NPB + F4TCNQ (9:1)(100) | 7.15 | Large increase in luminance stability compared to |

-continued

| Ex. # | Anode Capping Layer(s) | Electron Accepting Layer | Luminance Stability Ratio (vs Comp.) | Remarks |
|---|---|---|---|---|
| | | | | comparison example VIII-1. |

Group IX Examples (Electroluminescent color: White):
Layers of light emitting region for Group IX: NPB(300)/
NPB+BH2+Rub(49:49:2)(300)/BH2(300)/AlQ3(300)

| Ex. # | Anode Capping Layer(s) | Electron Accepting Layer | Luminance Stability Ratio (vs Comp.) | Remarks |
|---|---|---|---|---|
| IX-1 (Comp.) | None | NPB + F4TCNQ (9:1)(100) | 1 | Comparison example |
| IX-2 | NPB + Mg (1:1)(50) | NPB + F4TCNQ (9:1)(100) | 20 | Large increase in luminance stability compared to comparison example |

The above examples are intended to be illustrative only and the present invention is not intended to be limited to the materials, conditions, or process parameters recited herein.

The invention claimed is:

1. An organic light emitting device comprising:
a cathode;
a layer including an organic electroluminescent material;
a layer including an electron accepting material;
an anode capping layer comprising a mixture of inorganic material and organic material;
an anode; and
a substrate in the sequence before the cathode or after the anode,
wherein the anode capping layer is selected to provide the device with a luminance stability ratio that is greater than 1.

2. The device of claim 1, wherein the anode comprises indium tin oxide.

3. The device of claim 1, wherein the inorganic material is an inorganic metal containing material.

4. The device of claim 1, wherein the inorganic material is an elemental metal, or a metal alloy, or a mixture of the elemental metal and the metal alloy.

5. The device of claim 1, wherein the inorganic material is an elemental metal, or a metal alloy, or a mixture of the elemental metal and the metal alloy, wherein the elemental metal and the metals of the metal alloy are selected from the group consisting of Mg, Cr, Au, and Pd.

6. The device of claim 1, wherein the electron accepting material is selected from the group consisting of: tetracyanoquinodimethane compounds; thiopyranylidine compounds; polynitrofluorenone compounds; tetracyanoethylene compounds; chloranil compounds; carboxylfluorenone malonitrile compounds; N,N'bis(dialkyl)-1,4,5,8-naphthalenetetracarboxylic diimide compounds; N,N bis(diaryl)-1,4,5,8-naphthalenetetracarboxylic diimide compounds; carboxybenzylnaphthaquinone compounds; diphenoquionone compounds, inorganic Lewis acid compounds, and fullerene compounds, and a mixture thereof.

7. The device of claim 1, wherein the layer including an electron accepting material further includes an organic material.

8. The device of claim 1, wherein the electroluminescent layer is capable of emitting blue light.

9. The device of claim 1, wherein the electroluminescent layer is capable of emitting red light.

10. The device of claim 1, wherein the electroluminescent layer is capable of emitting green light.

11. The device of claim 1, wherein the electroluminescent layer is capable of emitting white light.

12. The device of claim 1, wherein the anode capping layer is selected such that the luminance stability ratio is greater than about 2.

13. The device of claim 1, wherein the anode capping layer is selected such that the luminance stability ratio is greater than about 5.

14. The device of claim 1, wherein the anode capping layer is selected such that the luminance stability ratio is greater than about 10.

15. The organic light emitting device of claim 1, wherein the anode capping layer is a multilayer structure comprising one layer of inorganic material and one layer of organic material.

16. The organic light emitting device of claim 15, wherein the inorganic material is one selected from the group consisting of Mg, Ca and mixture thereof.

17. The organic light emitting device of claim 16, wherein the organic material comprises NPB.

18. The organic light emitting device of claim 17, wherein the NPB layer is doped with $F_4$TCNQ.

19. The device of claim 1, wherein the inorganic material is one selected from the group consisting of C, Ge, Si, $SiO_2$, $Si_3N_4$, metal hydroxides, metal halides, metal sulfides, and metal nitrides.

20. An organic light emitting device comprising:
a cathode;
a layer including an organic electroluminescent material;
a layer including an electron accepting material;

an anode capping layer including a mixture of an organic material and of an elemental metal, or a metal alloy, or a mixture of the elemental metal and the metal alloy;

an anode; and a substrate in the sequence before the cathode or after the anode, wherein the anode capping layer is selected to provide the device with a luminance stability ratio that is greater than 1.

21. The device of claim 20, wherein the anode comprises indium tin oxide.

22. The device of claim 20, wherein the elemental metal and the metals of the metal alloy are selected from the group consisting of Mg, Cr, Au, and Pd.

23. The device of claim 20, wherein the electron accepting material is selected from the group consisting of: tetracyanoquinodimethane compounds; thiopyranylidine compounds; polynitrofluorenone compounds; tetracyanoethylene compounds; chloranil compounds; carboxylfluorenone malonitrile compounds; N,N'bis(dialkyl)-1,4,5,8-naphthalenetetracarboxylic diimide compounds; N,N'bis(diaryl)-1,4,5,8-naphthalenetetracarboxylic diimide compounds; carboxybenzylnaphthaquinone compounds; diphenoquionone compounds, inorganic Lewis acid compounds, and fullerene compounds, and a mixture thereof.

24. The device of claim 20, wherein the layer including an electron accepting material further includes an organic material.

25. The device of claim 20, wherein the electroluminescent layer is capable of emitting blue light.

26. The device of claim 20, wherein the electroluminescent layer is capable of emitting red light.

27. The device of claim 20, wherein the electroluminescent layer is capable of emitting green light.

28. The device of claim 20, wherein the electroluminescent layer is capable of emitting white light.

29. The device of claim 20, wherein the anode capping layer is selected such that the luminance stability ratio is greater than about 2.

30. The device of claim 20, wherein the anode capping layer is selected such that the luminance stability ratio is greater than about 5.

31. The device of claim 20, wherein the anode capping layer is selected such that the luminance stability ratio is greater than about 10.

32. An organic light emitting device comprising:

a cathode;

a layer including an organic electroluminescent material;

a multilayer anode capping layer comprising one layer of a mixture of an inorganic material selected from the group consisting of Mg, Ca, and mixture thereof, and of $F_4TCNQ$ doped NPB; and an anode, wherein the anode capping layer is selected to provide the device with a luminance stability ratio that is greater than 1.

* * * * *